United States Patent
Yumoto et al.

(10) Patent No.: US 11,478,868 B2
(45) Date of Patent: Oct. 25, 2022

(54) METHOD FOR PRODUCING BONDED BODY, METHOD FOR PRODUCING INSULATED CIRCUIT BOARD, AND METHOD FOR PRODUCING INSULATED CIRCUIT BOARD WITH HEATSINK

(71) Applicant: MITSUBISHI MATERIALS CORPORATION, Tokyo (JP)

(72) Inventors: Ryouhei Yumoto, Saitama (JP); Yoshiyuki Nagatomo, Saitama (JP); Soutarou Ooi, Saitama (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 581 days.

(21) Appl. No.: 16/491,028

(22) PCT Filed: Feb. 28, 2018

(86) PCT No.: PCT/JP2018/007598
§ 371 (c)(1),
(2) Date: Sep. 4, 2019

(87) PCT Pub. No.: WO2018/168476
PCT Pub. Date: Sep. 20, 2018

(65) Prior Publication Data
US 2020/0009671 A1    Jan. 9, 2020

(30) Foreign Application Priority Data
Mar. 17, 2017    (JP) ............................. JP2017-053689

(51) Int. Cl.
*H01L 33/48*    (2010.01)
*H01L 21/48*    (2006.01)
(Continued)

(52) U.S. Cl.
CPC ........ *B23K 1/0016* (2013.01); *H01L 21/4857* (2013.01); *H01L 21/4871* (2013.01);
(Continued)

(58) Field of Classification Search
CPC .. H01L 21/4857; H01L 21/4871; H01L 33/48
See application file for complete search history.

(56) References Cited

U.S. PATENT DOCUMENTS 5,654,586 A * 8/1997 Schwarzbauer ........ H01L 24/83
257/E23.109
10,418,295 B2 * 9/2019 Yokoyama .............. H01L 23/40
(Continued)

FOREIGN PATENT DOCUMENTS

| CN | 1391432 A | 1/2003 |
|---|---|---|
| CN | 102907186 A | 1/2013 |

(Continued)

OTHER PUBLICATIONS

Office Action dated Jan. 6, 2021, issued for Chinese Patent Application No. 201880013624.3 and an English translation of the Search Report.
(Continued)

*Primary Examiner* — Dale E Page
*Assistant Examiner* — Wilner Jean Baptiste
(74) *Attorney, Agent, or Firm* — Locke Lord LLP; James E. Armstrong, IV; Nicholas J. DiCeglie, Jr.

(57) ABSTRACT

A method for producing a bonded body includes: a laminating step of forming a laminated body in which a first member and a second member are temporarily bonded to each other by providing a temporary bonding material including an organic material on at least one of a bonding surface of the first member and a bonding surface of the second member; and a bonding step of pressurizing and heating the laminated body in a laminating direction and (Continued)

bonding the first member and the second member to each other. In the bonding step, during a temperature increase process of heating the laminated body up to a predetermined bonding temperature, at least a pressurization load P2 at a decomposition temperature $T_D$ of the organic material included in the temporary bonding material is lower than a pressurization load P1 at the bonding temperature.

11 Claims, 6 Drawing Sheets

(51) Int. Cl.
  *B23K 1/00* (2006.01)
  *H01L 23/12* (2006.01)
  *H01L 23/36* (2006.01)
  *B23K 101/42* (2006.01)

(52) U.S. Cl.
  CPC .............. *H01L 23/12* (2013.01); *H01L 23/36* (2013.01); *H01L 33/48* (2013.01); *B23K 2101/42* (2018.08)

(56) References Cited

U.S. PATENT DOCUMENTS

| | | | | |
|---|---|---|---|---|
| 2012/0267149 | A1* | 10/2012 | Oi | ....................... H01L 21/4807 29/846 |
| 2013/0149847 | A1 | 6/2013 | Satoh et al. | |
| 2014/0177158 | A1 | 6/2014 | Aleksov et al. | |
| 2015/0064401 | A1 | 3/2015 | Honda | |

FOREIGN PATENT DOCUMENTS

| | | |
|---|---|---|
| CN | 104126226 A | 10/2014 |
| CN | 105246260 A | 1/2016 |
| EP | 1267597 A2 | 12/2002 |
| JP | S56-042350 A | 4/1981 |
| JP | S64-010674 A | 1/1989 |
| JP | 06-134570 A | 5/1994 |
| JP | 3171234 B2 | 5/2001 |
| JP | 2004-186264 A | 7/2004 |
| JP | 2007-237239 A | 9/2007 |
| JP | 5403129 B2 | 1/2014 |
| JP | 2014-099596 A | 5/2014 |
| JP | 2014-175425 A | 9/2014 |
| JP | 2014-209591 A | 11/2014 |
| JP | 2015-070199 A | 4/2015 |
| JP | 2016-105452 A | 6/2016 |

OTHER PUBLICATIONS

Notice of Allowance dated Feb. 2, 2021, issued for Taiwanese Patent Application No. 107106857 and an English translation of the Search Report.
International Search Report dated May 15, 2018, issued for PCT/JP2018/007598 and English translation thereof.

\* cited by examiner

METHOD FOR PRODUCING BONDED BODY, METHOD FOR PRODUCING INSULATED CIRCUIT BOARD, AND METHOD FOR PRODUCING INSULATED CIRCUIT BOARD WITH HEATSINK

TECHNICAL FIELD

The present invention relates to a method for producing a bonded body in which a first member and a second member are bonded to each other, a method for producing an insulating circuit substrate using the method for producing a bonded body, and a method for producing an insulating circuit substrate with a heat sink Priority is claimed on Japanese Patent Application No. 2017-053689, filed on Mar. 17, 2017, the content of which is incorporated herein by reference.

BACKGROUND ART

A power module, a LED module, or a thermoelectric module has a structure in which a power semiconductor element, a LED element, or a thermoelectric element is bonded to an insulating circuit substrate in which a circuit layer formed of a conductive material is formed on a first surface of an insulating layer.

As the insulating circuit substrate, an insulating circuit substrate having a structure including a circuit layer that is formed by bonding a metal plate having excellent conductivity to a first surface of an insulating layer and a metal layer that is formed by bonding a metal plate having excellent heat radiation to a second surface of the insulating layer is provided. As the circuit layer or the metal layer, a laminated plate in which dissimilar metals are laminated may also be used.

In order to efficiently dissipate heat generated from an element or the like mounted on the circuit layer, an insulating circuit substrate with a heat sink in which a heat sink is bonded to the second surface side of the insulating layer is also provided.

For example, PTL 1 discloses a power module including: an insulating circuit substrate including a circuit layer that is formed on a first surface of a ceramic substrate using an aluminum plate and a metal layer that is formed on a second surface of the ceramic substrate using an aluminum plate; and a semiconductor element that is bonded to the circuit layer via a solder material. PTL 1 also discloses an insulating circuit substrate with a heat sink including the insulating circuit substrate and a heat sink PTL 2 discloses an insulating circuit substrate including a circuit layer that is formed by bonding an aluminum plate to a first surface of a ceramic substrate and bonding a copper plate to the aluminum plate by solid phase diffusion bonding.

PTL 3 discloses a LED module having a structure in which a conductive circuit layer is formed on a first surface of a base material formed of a ceramic, a radiator is bonded to a second surface of an insulated substrate, and a light emitting element is mounted on the circuit layer.

PTL 4 discloses a power module substrate with a heat sink in which one of a metal layer in a power module substrate and a heat sink is formed of aluminum or an aluminum alloy, the other of the metal layer and the heat sink is formed of copper or a copper alloy, and the metal layer and the heat sink are bonded to each other by solid phase diffusion bonding.

As a method for bonding members such as a ceramic substrate and a metal plate, an insulating circuit substrate and a heat sink, or an aluminum plate and a copper plate to each other to obtain a bonded body, PTLs 5 to 7 disclose a method for bonding members to each other by pressurizing and heating the members in a laminating direction in a state where the members are aligned and temporarily bonded using a temporary bonding material including an organic material such as polyethylene glycol.

CITATION LIST

Patent Literature

[PTL 1] Japanese Patent No. 3171234
[PTL 2] Japanese Patent No. 5403129
[PTL 3] Japanese Unexamined Patent Application, First Publication No. 2015-070199
[PTL 4] Japanese Unexamined Patent Application, First Publication No. 2014-099596
[PTL 5] Japanese Unexamined Patent Application, First Publication No. 2014-175425
[PTL 6] Japanese Unexamined Patent Application, First Publication No. 2014-209591
[PTL 7] Japanese Unexamined Patent Application, First Publication No. 2016-105452

DISCLOSURE OF INVENTION

Technical Problem

However, when the members are bonded to each other using the temporary bonding material, the organic material of the temporary bonding material is decomposed by heating to produce decomposition gas. When the members are pressurized in the laminating direction at a high load, the decomposition gas remains without being sufficiently exhausted from a bonded interface between the members, and there is a problem in that the members cannot be sufficiently bonded.

On the other hand, when the load at which the members are pressurized in the laminating direction is set to be low, the bonding strength between the members may be insufficient.

The present invention provides a method for producing a bonded body in which decomposition gas produced from an organic material of a temporary bonding material during bonding can be sufficiently exhausted from a bonded interface such that members can be stably bonded to each other, a method for producing an insulating circuit substrate using the method for producing a bonded body, and a method for producing an insulating circuit substrate with a heat sink.

Solution to Problem

According to the present invention, a method is provided for producing a bonded body in which a first member and a second member are bonded to each other, the method including: a laminating step of forming a laminated body in which the first member and the second member are temporarily bonded to each other by providing a temporary bonding material including an organic material on at least one of a bonding surface of the first member and a bonding surface of the second member and laminating the first member and the second member via the temporary bonding material; and a bonding step of pressurizing and heating the laminated body in a laminating direction and bonding the first member and the second member to each other. In the bonding step, during a temperature increase process of heating the laminated body up to a predetermined bonding temperature (heating temperature during bonding), at least a pressurization load P2 at a decomposition temperature $T_D$ of the organic material included in the temporary bonding material is set to be lower than a pressurization load P1 at the bonding temperature.

In the method, in the bonding step, during a temperature increase process of heating the laminated body up to a predetermined bonding temperature, at least a pressurization load P2 at a decomposition temperature $T_D$ of the organic material included in the temporary bonding material is set to be lower than a pressurization load P1 at the bonding temperature. Therefore, when the organic material of the temporary bonding material is decomposed to produce decomposition gas, the first member and the second member are not strongly pressed. Therefore, the exhaust of the decomposition gas is not interfered with, and the decomposition gas can be rapidly exhausted from the bonded interface. On the other hand, after sufficiently exhausting the decomposition gas from the interface to be bonded, the pressurization load P1 at the bonding temperature can be set to be high. Therefore, the first member and the second member can be reliably bonded to each other without an effect of the decomposition gas remaining in the interface.

Even when the temporary bonding material includes plural kinds of organic materials, the decomposition temperature of an organic material having the highest decomposition temperature is defined as "the decomposition temperature $T_D$ of the organic material included in the temporary bonding material" in this specification.

It is preferable that, when the decomposition temperature of the organic material included in the temporary bonding material is represented by $T_D$, the pressurization load P2 be in a decomposition temperature range of $T_D-10°$ C. to $T_D+10°$ C. When the pressurization load varies in the decomposition temperature range, the average pressurization load is used. In this case, by setting the pressurization load P2 in the decomposition temperature range of $T_D-10°$ C. to $T_D+10°$ C. with respect to the decomposition temperature $T_D$ of the organic material included in the temporary bonding material to be lower than the pressurization load P1 at the bonding temperature, the decomposition gas can be rapidly exhausted from the bonded interface.

In the method for producing a bonded body according to the aspect of the present invention, it is preferable that the pressurization load P2 be in a range of 0.1 MPa to 0.7 MPa. In this case, the pressurization load P2 at least at the decomposition temperature $T_D$ of the organic material included in the temporary bonding material is set to be relatively low in a range of 0.1 MPa to 0.7 MPa. Therefore, the decomposition gas is not confined in the interface, the exhaust of the decomposition gas is not interfered with, the decomposition gas can be rapidly and sufficiently exhausted from the bonded interface, and the possibility of occurrence of bonding defects caused by the decomposition gas remaining in the bonded interface can be reduced.

According to the present invention, a method is provided for producing an insulating circuit substrate including an insulating layer and a metal plate that is bonded to at least a single surface of the insulating layer, in which the insulating layer as the first member and the metal plate as the second member are bonded to each other using the method for producing a bonded body.

In this method, the insulating layer and the metal plate are bonded to each other using the method for producing a bonded body. Therefore, the decomposition gas of the organic material included in the temporary bonding material can be effectively exhausted from a bonded interface between the insulating layer and the metal plate, and the insulating layer and the metal plate can be sufficiently bonded to each other.

According to the present invention, a method is provided for producing an insulating circuit substrate including an insulating layer and a metal plate that is bonded to at least a single surface of the insulating layer, in which the metal plate is a laminated plate including a first metal plate and a second metal plate that is formed of a material different from that of the first metal plate, and the first metal plate as the first member and the second metal plate as the second member are bonded to each other using the method for producing a bonded body.

In this method, the first metal plate and the second metal plate are bonded to each other using the method for producing a bonded body. Therefore, the decomposition gas of the organic material included in the temporary bonding material can be effectively exhausted from a bonded interface between the first metal plate and the second metal plate, and the first metal plate and the second metal plate can be sufficiently bonded to each other.

According to the present invention, a method is provided for producing an insulating circuit substrate with a heat sink including an insulating circuit substrate and a heat sink, the insulating circuit substrate including an insulating layer and a metal plate that is bonded to at least a single surface of the insulating layer, and the heat sink being provided on another surface side of the insulating layer, in which the insulating circuit substrate as the first member and the heat sink as the second member are bonded to each other using the method for producing a bonded body.

In this method, the insulating circuit substrate and the heat sink are bonded to each other using the method for producing a bonded body. Therefore, the decomposition gas of the organic material included in the temporary bonding material can be effectively exhausted from a bonded interface between the insulating circuit substrate and the heat sink, and the insulating circuit substrate and the heat sink can be sufficiently bonded to each other.

Advantageous Effects of Invention

According to the present invention, decomposition gas produced from an organic material of a temporary bonding material during bonding can be sufficiently exhausted from a bonded interface such that members can be stably bonded to each other.

BEST MODE FOR CARRYING OUT THE INVENTION

Hereinafter, an embodiment of the present invention will be described with reference to the drawings.

Figure 1:
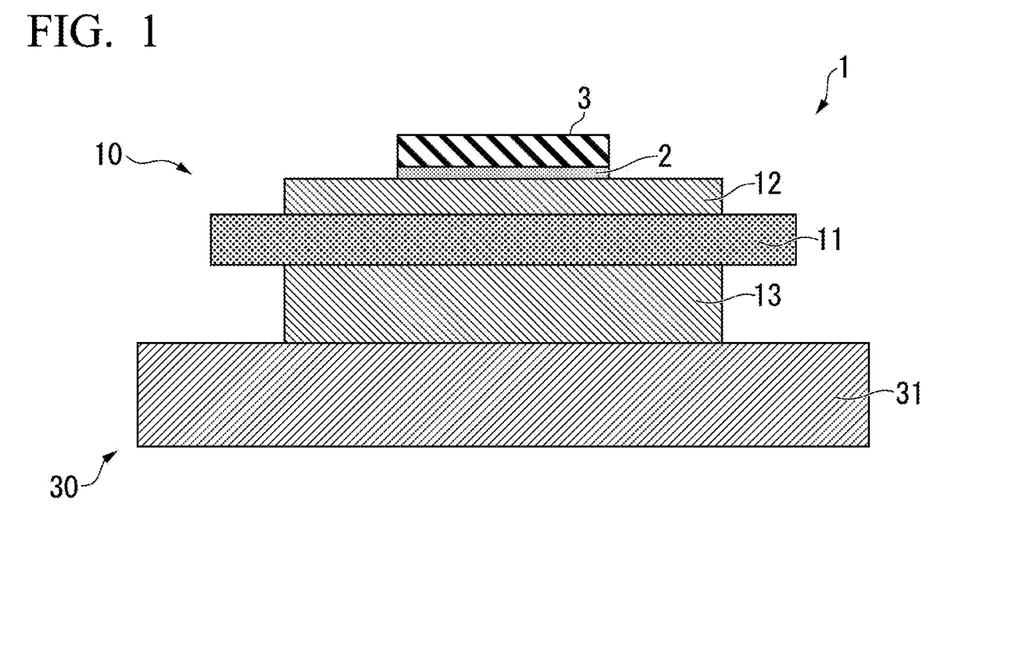
FIG. 1 is a cross-sectional view illustrating a power module produced according to an embodiment of the present invention.

FIG. 1 is a power module 1 produced according to an embodiment of the present invention.

The power module 1 includes: an insulating circuit substrate with a heat sink 30; and a semiconductor element 3 that is bonded to a first side (upper side in FIG. 1) of the insulating circuit substrate with a heat sink 30 via a solder layer 2. The insulating circuit substrate with a heat sink 30 includes: an insulating circuit substrate 10; and a heat sink 31 that is bonded to a second side (lower side in FIG. 1) of the insulating circuit substrate 10. Each of the insulating circuit substrate 10 and the insulating circuit substrate with a heat sink 30 are produced according to the embodiment of the present invention.

The solder layer 2 is formed of, for example, a Sn—Ag-based solder material, a Sn—Cu-based solder material, a Sn—In-based solder material, or a Sn—Ag—Cu-based solder material (so-called lead-free solder material). The semiconductor element 3 is an electronic component including a semiconductor, and various semiconductor elements can be selected depending on required functions.

As illustrated in FIG. 1, the insulating circuit substrate 10 includes: a flat ceramic substrate 11 that is an insulating layer; a flat circuit layer 12 that is provided on a first surface (in FIG. 1, an upper surface) of the ceramic substrate 11; and a flat metal layer 13 that is formed on a second surface (in FIG. 1, a lower surface) of the ceramic substrate 11. In this embodiment, for reliable insulation, the planar dimensions of the circuit layer 12 and the metal layer 13 are less than that of the ceramic substrate 11. These planar shapes may be any shape such as a rectangular shape according to the intended use.

The ceramic substrate 11 prevents electrical connection between the circuit layer 12 and the metal layer 13 and is formed of, for example, AlN (aluminum nitride) having high insulating properties without any particular limitation. The thickness of the ceramic substrate 11 may be set in a range of 0.2 mm to 1.5 mm and may be set as, for example, 0.635 mm.

The circuit layer 12 is formed by bonding a metal plate having high conductivity formed of aluminum, an aluminum alloy, copper, or a copper alloy to the first surface (in FIG. 1, the upper surface) of the ceramic substrate 11. A thickness t1 of the circuit layer 12 is set in a range of 0.1 mm to 1.0 mm. In the embodiment, the circuit layer 12 is preferably formed by bonding an aluminum plate 22 formed of a rolled plate of aluminum (hereinafter, referred to as "2N aluminum") having a purity of 99.00 mass % or higher and lower than 99.50 mass % to the first surface of the ceramic substrate 11. A thickness t1 of the aluminum plate 22 is not particularly limited and is, for example, 0.6 mm.

The metal layer 13 is formed by bonding a metal plate formed of aluminum, an aluminum alloy, copper, or a copper alloy to the second surface (in FIG. 1, the lower surface) of the ceramic substrate 11. A thickness t2 of the metal layer 13 may be set in a range of 0.6 mm to 6.0 mm. In the embodiment, the metal layer 13 is preferably formed by bonding an aluminum plate 23 formed of a rolled plate of aluminum (hereinafter, referred to as "4N aluminum") having a purity of 99.99 mass % or higher to the second surface of the ceramic substrate 11. A thickness t2 of the aluminum plate 23 is not particularly limited and is, for example, 1.6 mm.

The heat sink 31 dissipates heat on the insulating circuit substrate 10 side. The heat sink 31 is formed of copper or a copper alloy having excellent thermal conductivity and, in the embodiment, may be formed of oxygen free copper. The thickness of the heat sink 31 may be set in a range of 3 mm to 10 mm.

In the embodiment, the metal layer 13 of the insulating circuit substrate 10 and the heat sink 31 may be bonded to each other by solid phase diffusion bonding.

Figure 2:
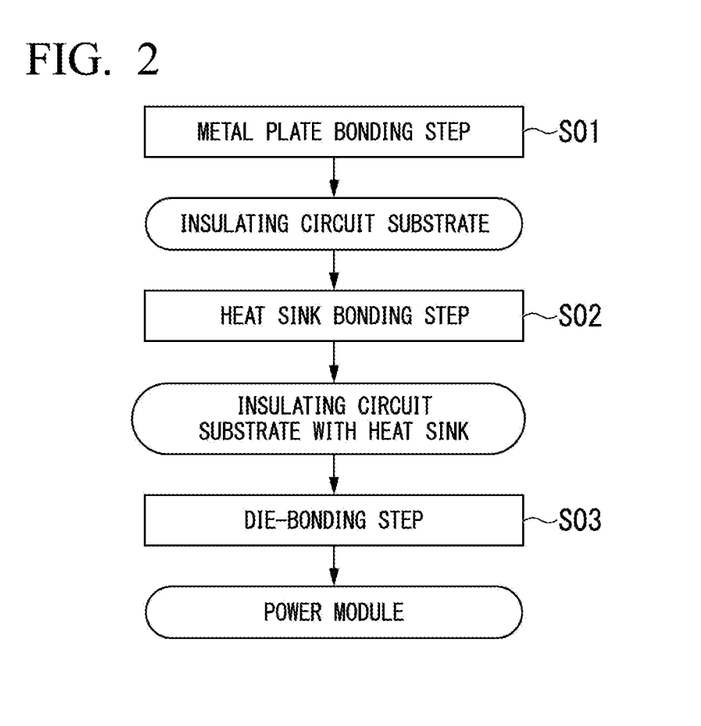
FIG. 2 is a flowchart illustrating a method for producing an insulating circuit substrate illustrated in FIG. 1 and a method for producing an insulating circuit substrate with a heat sink illustrated in FIG. 1.

Next, a method for producing the insulating circuit substrate and a method for producing the insulating circuit substrate with a heat sink according to the embodiment will be described using FIGS. 2 to 4. First, as illustrated in FIG. 3, the metal plate 22 is bonded to the first surface of the ceramic substrate 11 to form the circuit layer 12, and the metal plate 23 is bonded to the second surface of the ceramic substrate 11 to form the metal layer 13 (metal plate bonding step S01).

In the embodiment, as the metal plates 22 and 23, the aluminum plates 22 and 23 formed of aluminum (2N—Al) having a purity of 99 mass % or higher may be used.

Figure 3:
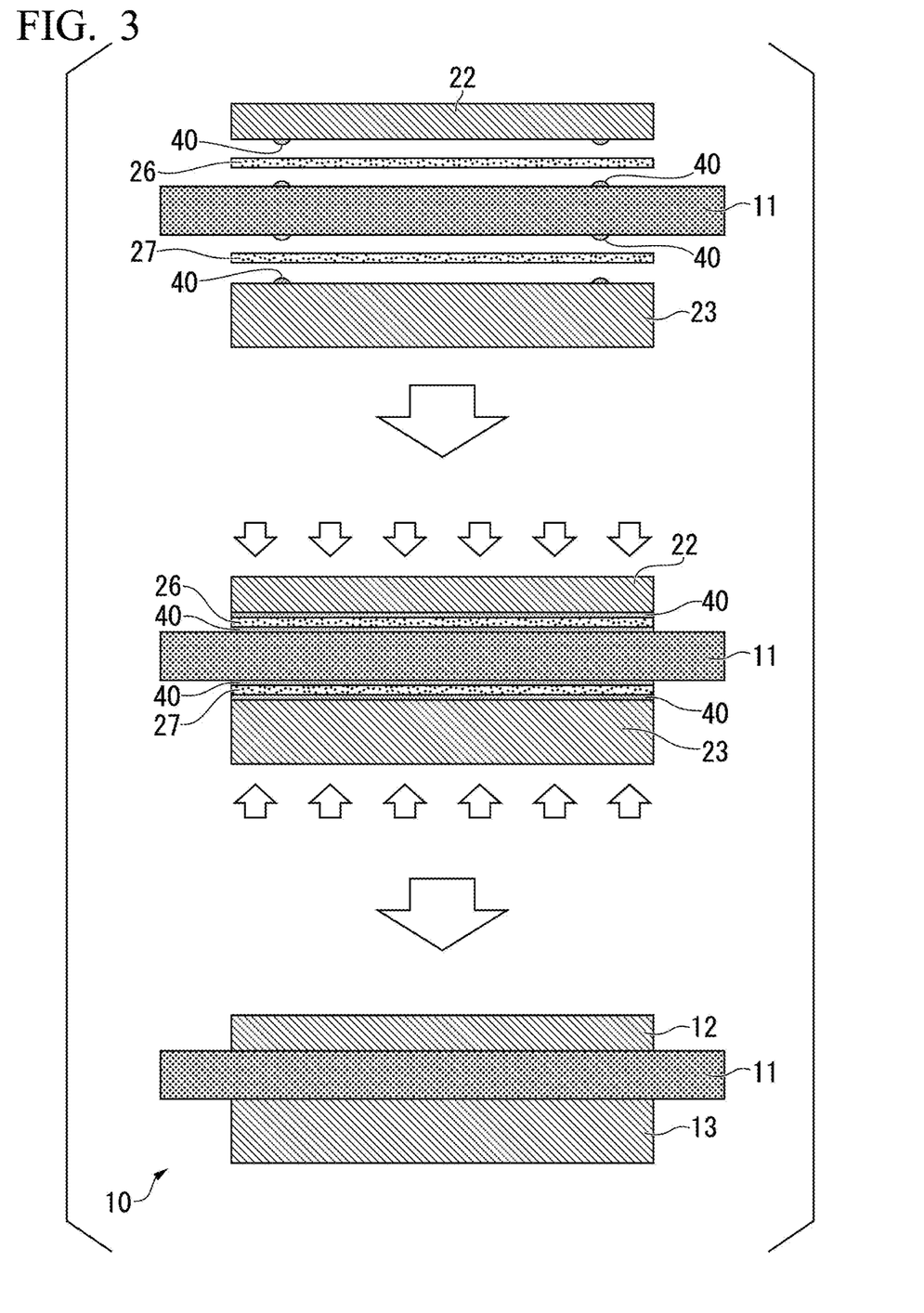
FIG. 3 is a cross-sectional view illustrating the method for producing the insulating circuit substrate illustrated in FIG. 1.

In the metal plate bonding step S01, as illustrated in FIG. 3, the metal plate 22 that is the circuit layer 12 is laminated on the first surface of the ceramic substrate 11 with a foil-shaped Al—Si-based brazing material 26 interposed therebetween. A planar shape of the brazing material 26 is the same as or slightly less than a bottom shape of the metal plate 22. On the other hand, the metal plate 23 that is the metal layer 13 is laminated on the second surface of the ceramic substrate 11 with a foil-shaped Al—Si-based brazing material 27 interposed therebetween. A planar shape of the brazing material 27 is the same as or slightly less than a bottom shape of the metal plate 23. In the Al—Si brazing materials 26 and 27, the Si concentration is preferably in a range of 1 mass % to 12 mass %. In addition, the thicknesses of the Al—Si brazing materials 26 and 27 are preferably in a range of 5 μm to 15 μm.

At this time, a temporary bonding material 40 is provided on a bonding surface of the metal plate 22, a bonding surface of the metal plate 23, and a bonding surface of the ceramic substrate 11 such that the metal plate 22, the brazing material 26, the ceramic substrate 11, the brazing material 27, and the metal plate 23 are aligned relative to each other and are temporarily bonded.

The arrangement of the temporary bonding material 40 is not particularly limited. For example, as illustrated in FIG. 3, the temporary bonding material 40 may be applied using a dispenser in a linear shape or a belt shape to a position positioned inside at a predetermined distance from an outer periphery of each of the metal plate 22 and the metal plate 23, or may be attached in a form of a plurality of dots. The temporary bonding material 40 may be applied to a portion, a pattern portion, or the entire area of the bonding surface using a screen printing. It is preferable that the amount of the temporary bonding material 40 attached be as small as possible within a range where an interface that is temporarily bonded during the following operation is not shifted.

The temporary bonding material 40 may be, for example, a kneaded material of a resin and a solvent. In this case, examples of the resin include ethyl cellulose, methyl cellulose, polymethyl methacrylate, an acrylic resin, a styrene resin, an ester resin, a phenol resin, a urethane resin, a melamine resin, a urea resin, an epoxy resin, a xylene resin, an alkyd resin, an aliphatic hydrocarbon resin, a butyral resin, a maleic resin, a fumaric acid resin, and a mixture of one or more kinds thereof. Examples of the solvent include methyl cellosolve, ethyl cellosolve, α-terpineol, toluene, texanol, triethyl citrate, and a mixture of one or more kinds thereof. After the application, the solvent is volatilized, and a temporary bonding effect is obtained by the resin that remains.

As the temporary bonding material 40, polyethylene glycol (PEG) can also be used. The melting temperature of polyethylene glycol (PEG) varies depending on the weight average molecular weight. Therefore, when PEG that is solid at room temperature (25° C.) is used for temporary bonding, the respective members are laminated and aligned after heating PEG to be melted, and then the molten PEG is cooled to be solidified for temporary bonding.

As the temporary bonding material 40, a saturated fatty acid such as lauric acid, myristic acid, palmitic acid, stearic acid, or a mixture of one or more kinds thereof can also be used. This saturated fatty acid is typically solid at room temperature (25° C.) and thus can be used in the same manner as that in a case where the solid PEG is used at room temperature (25° C.).

Next, in a state where the laminated body of the metal plate 22, the brazing material 26, the ceramic substrate 11, the brazing material 27, and the metal plate 23 that are temporarily bonded to each other is pressurized using a pressure device in a laminating direction, the laminated body is charged into a vacuum heating furnace and is heated in the vacuum heating furnace. As a result, the metal plate 22 and the ceramic substrate 11 are bonded to each other to form the circuit layer 12, and the metal plate 23 and the ceramic substrate 11 are bonded to each other to form the metal layer 13.

It is preferable that bonding conditions in the metal plate bonding step S01 be set as follows: the degree of vacuum is in a range of $10^{-6}$ Pa to $10^{-3}$ Pa, the bonding temperature is in a range of 560° C. to 655° C., and the holding time at the bonding temperature is in a range of 10 minutes to 45 minutes.

In the metal plate bonding step S01, during a temperature increase process of heating the laminated body up to a bonding temperature, when a decomposition temperature of an organic material included in the temporary bonding material 40 is represented by $T_D$, a pressurization load P2 in a decomposition temperature range of $T_D-10°$ C. to $T_D+10°$ C. may be set to be lower than a pressurization load P1 at the bonding temperature. That is, in this method, the pressurization load P2 is defined with respect to the decomposition temperature $T_D$ of the organic material of the temporary bonding material 40 provided on the ceramic substrate 11 and the metal plates 22 and 23.

Using a thermal gravimetric-differential thermal analyzer (TG-DTA), the decomposition temperature $T_D$ of the organic material included in the temporary bonding material 40 is a temperature measured when a weight loss ratio of the organic material is 95% or higher by heating the temporary bonding material 40 in an inert gas (Ar) atmosphere at a temperature increase rate of 10° C./min. As described above, in order to control the pressurization loads during the temperature increase process, at the bonding temperature, and during a temperature decrease process, in the embodiment, it is preferable that the laminated body be pressurized using a hot press device.

In the embodiment, it is preferable that the pressurization load P1 at the bonding temperature of the laminated body be set to be in a range of 0.8 MPa to 3.5 MPa (8 kgf/cm$^2$ to 35 kgf/cm$^2$).

In addition, during the temperature increase process to the bonding temperature, the pressurization load P2 in the decomposition temperature range of $T_D-10°$ C. to $T_D+10°$ C. is preferably set to be in a range of 0.1 MPa to 0.7 MPa (1 kgf/cm$^2$ to 7 kgf/cm$^2$).

As a result, a ratio P1/P2 of the pressurization load P1 at the bonding temperature to the pressurization load P2 in the decomposition temperature range of $T_D-10°$ C. to $T_D+10°$ C. is preferably in a range of 1.1 to 35.0.

The lower limit of the pressurization load P1 is preferably 0.8 MPa or higher (8 kgf/cm$^2$ or higher) and more preferably 1.2 MPa or higher (12 kgf/cm$^2$ or higher). The upper limit of the pressurization load P1 is preferably 3.5 MPa or lower (35 kgf/cm$^2$ or lower) and more preferably 2.8 MPa or lower (28 kgf/cm$^2$ or lower).

The lower limit of the bonding temperature is preferably 560° C. or higher and more preferably 610° C. or higher. The upper limit of the bonding temperature is preferably 655° C. or lower and more preferably 650° C. or lower.

The lower limit of the holding time at the bonding temperature is preferably 10 minutes or longer and more preferably 15 minutes or longer. The upper limit of the holding time at the bonding temperature is preferably 45 minutes or shorter and more preferably 30 minutes or shorter.

Through the above-described steps, the insulating circuit substrate 10 according to the embodiment is produced.

Figure 4:
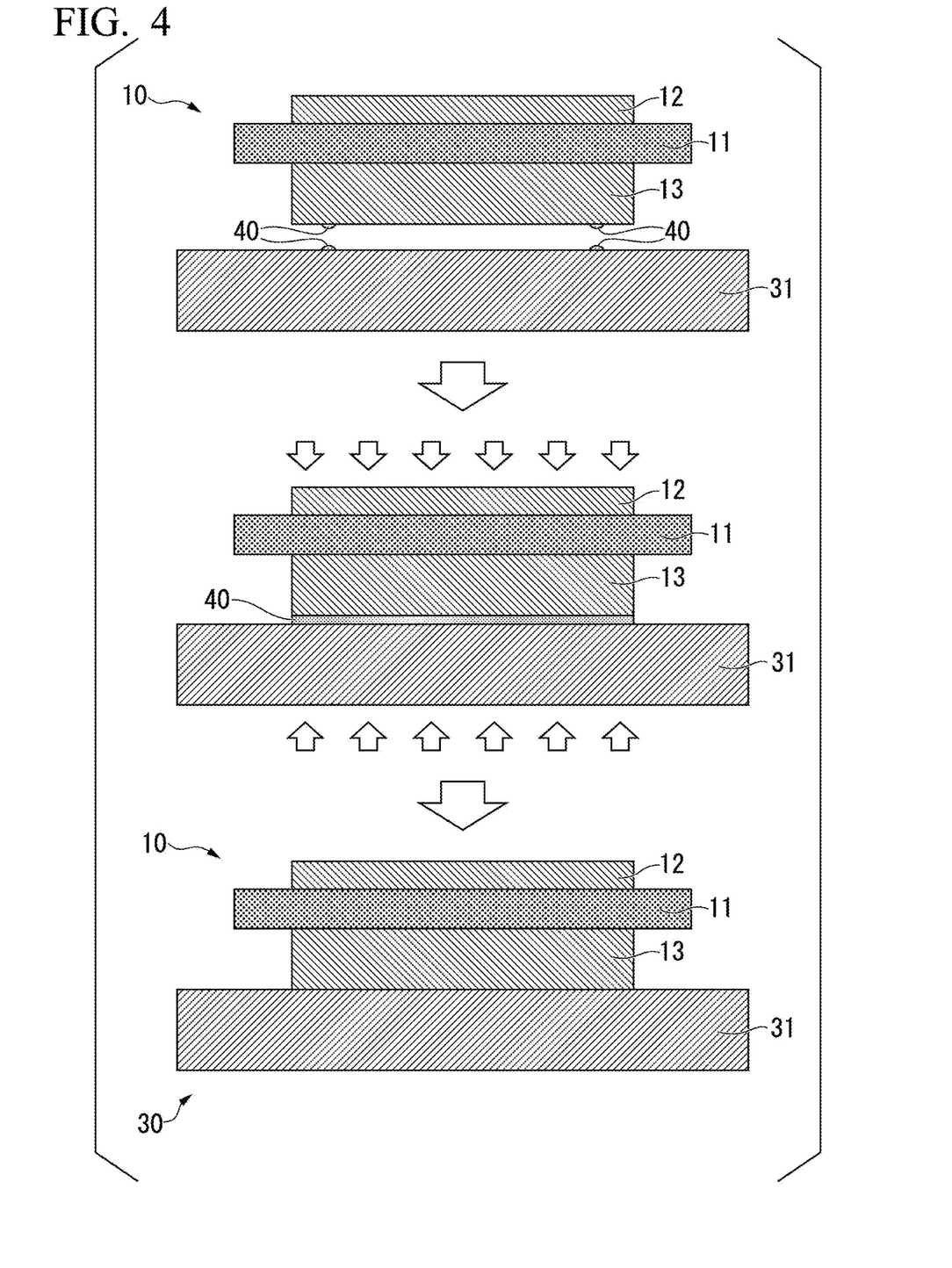
FIG. 4 is a cross-sectional view illustrating the method for producing the insulating circuit substrate with a heat sink illustrated in HG 1.

Next, as illustrated in FIG. 4, the heat sink 31 is laminated on a second side (in FIG. 4, a lower side) of the metal layer 13 of the insulating circuit substrate 10. In a state where a heat sink laminated body in which the insulating circuit substrate 10 and the heat sink 31 are laminated is pressurized using a pressure device in the laminating direction, the heat sink laminated body is charged into a vacuum heating furnace and is held at a bonding temperature that is lower than an eutectic temperature of aluminum and copper. As a result, the metal layer 13 and the heat sink 31 are bonded to each other by solid phase diffusion bonding (heat sink bonding step S02).

At this time, the temporary bonding material 40 is provided on the bonding surface of the metal layer 13 and the bonding surface of the heat sink 31, and the metal layer 13 and the heat sink 31 are aligned and temporarily bonded. As the temporary bonding material 40 used in the heat sink bonding step S02, the temporary bonding material 40 used in the metal plate bonding step S01 can be adopted.

Next, in a state where a heat sink laminated body in which the insulating circuit substrate 10 and the heat sink 31 are laminated is pressurized using a pressure device in the laminating direction, the heat sink laminated body is charged into a vacuum heating furnace such that the metal layer 13 and the heat sink 31 are bonded to each other by solid phase diffusion bonding. It is preferable that bonding conditions in the heat sink bonding step S02 be set as follows: the vacuum condition is in a range of $10^{-6}$ Pa to $10^{-3}$ Pa, the bonding temperature is in a range of 440° C. to 548° C., and the holding time at the bonding temperature is in a range of 30 minutes to 150 minutes.

In the heat sink bonding step S02, during a temperature increase process of heating the heat sink laminated body up to the bonding temperature, a pressurization load P12 in a decomposition temperature range of $T_D$−10° C. to $T_D$+10° C. may be set to be lower than a pressurization load P11 at the bonding temperature. That is, the pressurization load P12 is defined with respect to the decomposition temperature $T_D$ of the organic material of the temporary bonding material 40 provided in the metal layer 13 and the heat sink 31. As described above, in order to control the pressurization loads during the temperature increase process, at the bonding temperature, and during a temperature decrease process, in the embodiment, it is preferable that the heat sink laminated body be pressurized using a hot press device.

In the embodiment, the pressurization load P11 at the bonding temperature of the heat sink laminated body is set to be in a range of 0.8 MPa to 3.5 MPa (8 kgf/cm$^2$ to 35 kgf/cm$^2$).

In addition, during the temperature increase process to the bonding temperature, the pressurization load P12 in the decomposition temperature range of $T_D$−10° C. to $T_D$+10° C. is set to be in a range of 0.1 MPa to 0.7 MPa (1 kgf/cm$^2$ to 7 kgf/cm$^2$).

A ratio P11/P12 of the pressurization load P11 at the bonding temperature to the pressurization load P12 in the decomposition temperature range of $T_D$−10° C. to $T_D$+10° C. during the temperature increase process is preferably in a range of 1.1 to 35.0.

The lower limit of the pressurization load P11 is preferably 0.8 MPa or higher (8 kgf/cm$^2$ or higher) and more preferably 1.2 MPa or higher (12 kgf/cm$^2$ or higher). The upper limit of the pressurization load P11 is preferably 3.5 MPa or lower (35 kgf/cm$^2$ or lower) and more preferably 2.8 MPa or lower (28 kgf/cm$^2$ or lower).

The lower limit of the bonding temperature is preferably 440° C. or higher and more preferably 500° C. or higher. The upper limit of the bonding temperature is preferably 548° C. or lower and more preferably 530° C. or lower.

The lower limit of the holding time at the bonding temperature is preferably 30 minutes or longer and more preferably 60 minutes or longer. The upper limit of the holding time at the bonding temperature is preferably 150 minutes or shorter and more preferably 120 minutes or shorter.

Through the above-described steps, the insulating circuit substrate with a heat sink 30 according to the embodiment is produced.

Next, the semiconductor element 3 is laminated on a first surface of the circuit layer 12 through a solder material and is bonded thereto by solder bonding in a heating furnace (die-bonding step S03).

As described above, a power module 1 according to the embodiment is produced.

In the method for producing the insulating circuit substrate, in the metal plate bonding step S01, during the temperature increase process of heating the laminated body up to the bonding temperature, when the decomposition temperature of the organic material included in the temporary bonding material 40 is represented by $T_D$, the pressurization load P2 in the decomposition temperature range of $T_D$−10° C. to $T_D$+10° C. may be set to be lower than the pressurization load P1 at the bonding temperature. Therefore, when the organic material of the temporary bonding material 40 is decomposed to produce decomposition gas, the metal plates 22 and 23 and the ceramic substrate 11 are not strongly pressed, and the decomposition gas can be rapidly exhausted without being confined in the bonded interfaces between the metal plates 22 and 23 and the ceramic substrate 11. In addition, the pressurization force can be increased up to the pressurization load P1 by increasing the temperature up to the bonding temperature after removing the decomposition gas. Therefore, the metal plates 22 and 23 and the ceramic substrate 11 can be reliably bonded to each other without an adverse effect of the decomposition gas remaining in the interfaces, and the insulating circuit substrate 10 having excellent bonding reliability can be produced.

In addition, when the pressurization load P2 in the decomposition temperature range of $T_D$−10° C. to $T_D$+10° C. is set to be in a range of 0.1 MPa to 0.7 MPa (1 kgf/cm$^2$ to 7 kgf/cm$^2$), the decomposition gas of the organic material included in the temporary bonding material 40 can be reliably exhausted from the bonded interface, and the occurrence of bonding defects can be reliably suppressed due to the remaining decomposition gas. In addition, when the pressurization load P1 at the bonding temperature is set to be in a range of 0.8 MPa to 3.5 MPa (8 kgf/cm$^2$ to 35 kgf/cm$^2$), the ceramic substrate 11 and the metal plates 22 and 23 can be strongly bonded to each other.

In the heat sink bonding step S02, during the temperature increase process of heating the heat sink laminated body up to the bonding temperature, the pressurization load P12 in the decomposition temperature range of $T_D$−10° C. to $T_D$+10° C. with respect to the decomposition temperature $T_D$ of the organic material included in the temporary bonding material 40 is set to be lower than a pressurization load P11 at the bonding temperature. Therefore, when the organic material of the temporary bonding material 40 is decomposed to produce decomposition gas, the metal layer 13 and the heat sink 31 are not strongly pressed, and the decomposition gas can be rapidly exhausted from the bonded interface between the metal layer 13 and the heat sink 31. In addition, after removing the decomposition gas, the pressurization load P11 at the bonding temperature can be set to be high. Accordingly, the metal layer 13 and the heat sink 31 can be reliably secured, and the insulating circuit substrate with a heat sink 30 having excellent bonding reliability can be produced.

In addition, during the temperature increase process to the bonding temperature, when the pressurization load P12 in the decomposition temperature range of $T_D$−10° C. to $T_D$+10° C. with respect to the decomposition temperature $T_D$ of the organic material included in the temporary bonding material 40 is set to be in a range of 0.1 MPa to 0.7 MPa (1 kgf/cm$^2$ to 7 kgf/cm$^2$), the decomposition gas of the organic material included in the temporary bonding material 40 can be reliably exhausted from the bonded interface, and the occurrence of bonding defects can be reliably suppressed due to the remaining decomposition gas.

In addition, when the pressurization load P11 at the bonding temperature is set to be in a range of 0.8 MPa to 3.5 MPa (8 kgf/cm$^2$ to 35 kgf/cm$^2$), the metal layer 13 and the heat sink 31 can be strongly bonded to each other.

Next, a method for producing an insulating circuit substrate according to a second embodiment of the present invention will be described with reference to FIGS. 5 to 7. The same members as those of the first embodiment will be represented by the same reference numerals, and the description thereof will not be repeated.

Figure 5:
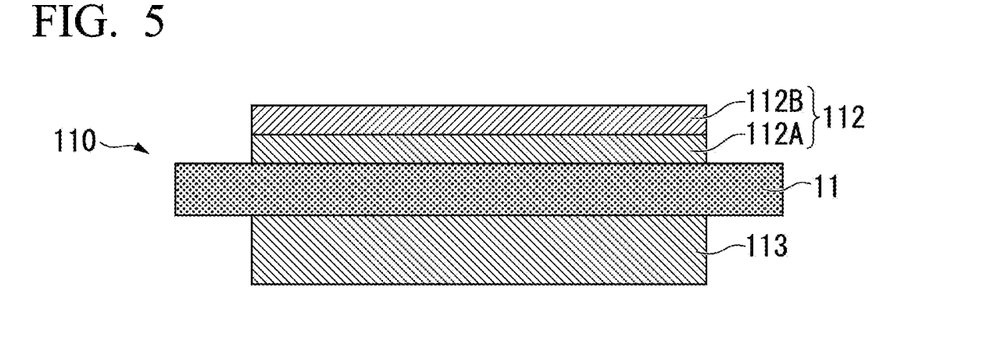
FIG. 5 is a cross-sectional view illustrating an insulating circuit substrate produced using a method for producing an insulating circuit substrate according to a second embodiment of the present invention.
Figure 6:
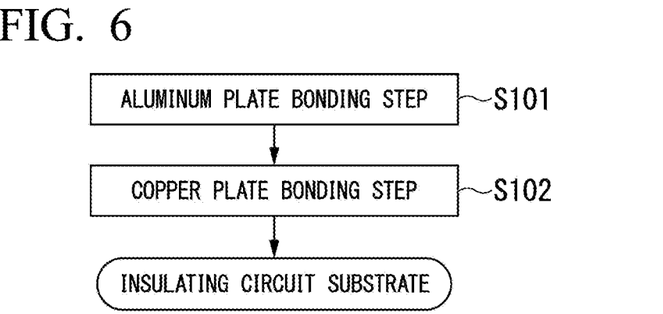
FIG. 6 is a flowchart illustrating the method for producing the insulating circuit substrate illustrated in FIG. 5.

As illustrated in FIG. 5, the insulating circuit substrate 110 includes: the ceramic substrate 11 (insulating layer); a circuit layer 112 that is provided on the first surface (in FIG. 5, the upper surface) of the ceramic substrate 11; and a metal layer 113 that is formed on the second surface (in FIG. 5, the lower surface) of the ceramic substrate 11.

Figure 7:
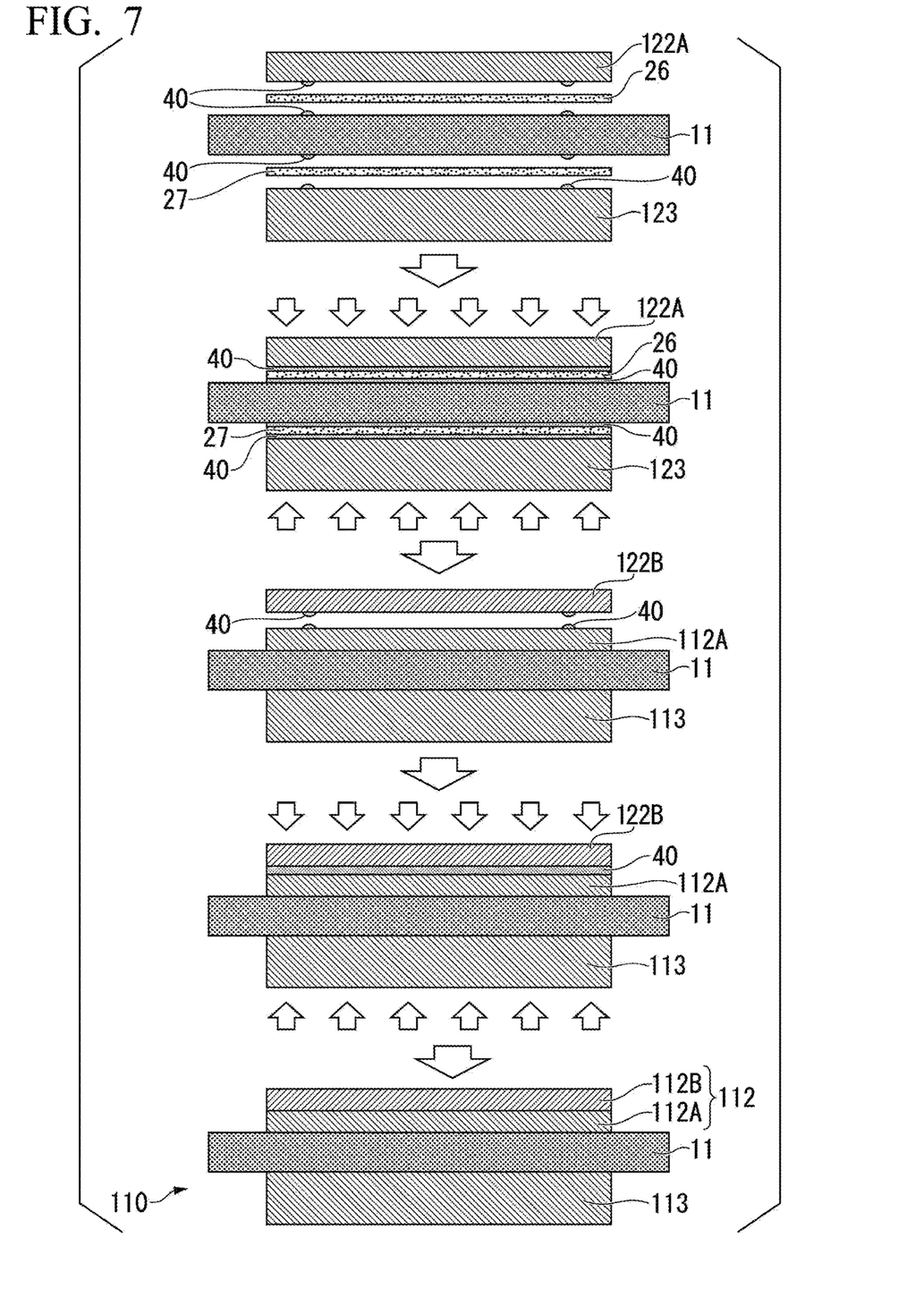
FIG. 7 is a cross-sectional view illustrating the method for producing the insulating circuit substrate illustrated in FIG. 5.

As illustrated in FIG. 7, the metal layer 113 is formed by bonding a metal plate 123 to the second surface (in FIG. 5, the lower surface) of the ceramic substrate 11. In the embodiment, the metal plate 123 is an aluminum plate formed of aluminum or an aluminum alloy.

As illustrated in FIG. 5, the circuit layer 112 includes: an aluminum layer 112A that is provided on the first surface of the ceramic substrate 11; and a copper layer 112B that is laminated on a first side (in FIG. 5, an upper side) of the aluminum layer 112A.

As illustrated in FIG. 7, the aluminum layer 112A is formed by bonding an aluminum plate 122A to the first surface of the ceramic substrate 11. In the embodiment, the aluminum layer 112A is formed by bonding the aluminum plate 122A formed of a rolled plate of aluminum (hereinafter, referred to as "4N aluminum") having a purity of 99.99 mass % or higher to the ceramic substrate 11. The copper layer 112B is bonded to and formed on the first side (in FIG. 5, the upper side) of the aluminum layer 112A. In the embodiment, as illustrated in FIG. 7, the copper layer 112B is formed by bonding the copper plate 122B formed of a rolled plate of oxygen free copper to the aluminum layer 112A by solid phase diffusion bonding.

The method for producing the insulating circuit substrate according to the embodiment will be described with reference to FIGS. 6 and 7. First, as illustrated in FIG. 7, the aluminum plate 122A is bonded to the first surface of the ceramic substrate 11 to form the aluminum layer 112A, and the metal plate (aluminum plate) 123 is bonded to the second surface of the ceramic substrate 11 to form the metal layer 113 (aluminum plate bonding step S101).

In the aluminum plate bonding step S101, as illustrated in FIG. 7, the aluminum plate 122A that is the aluminum layer 112A is laminated on the first surface of the ceramic substrate 11 with the Al—Si-based brazing material 26 interposed therebetween, and the metal plate (aluminum plate) 123 that is the metal layer 13 is laminated on the second surface of the ceramic substrate 11 with the Al—Si brazing material 27 interposed therebetween.

At this time, the temporary bonding materials 40 is provided on a bonding surface of the aluminum plate 122A, a bonding surface of the metal plate (aluminum plate) 123, and a bonding surface of the ceramic substrate 11 such that the aluminum plate 122A, the brazing material 26, the ceramic substrate 11, the brazing material 27, and the metal plate (aluminum plate) 123 are aligned and temporarily bonded.

Next, in a state where the laminated body of the aluminum plate 122A, the brazing material 26, the ceramic substrate 11, the brazing material 27, and the metal plate (aluminum plate) 123 is pressurized using a pressure device in the laminating direction, the laminated body is charged into a vacuum heating furnace, the aluminum plate 122A and the ceramic substrate 11 are bonded to each other to form the aluminum layer 112A, and the metal plate (aluminum plate) 123 and the ceramic substrate 11 are bonded to each other to form the metal layer 113.

It is preferable that bonding conditions in the aluminum plate bonding step S101 be set as follows: the vacuum condition is in a range of $10^{-6}$ Pa to $10^{-3}$ Pa, the bonding temperature is in a range of 560° C. to 655° C., and the holding time at the bonding temperature is in a range of 10 minutes to 150 minutes.

In the aluminum plate bonding step S101, during the temperature increase process of heating the laminated body up to the bonding temperature, the pressurization load P2 in the decomposition temperature range of $T_D-10°$ C. to $T_D+10°$ C. with respect to the decomposition temperature $T_D$ of the organic material included in the temporary bonding material 40 is set to be lower than the pressurization load P1 at the bonding temperature. As described above, in order to control the pressurization loads during the temperature increase process, at the bonding temperature, and during a temperature decrease process, in the embodiment, the laminated body is pressurized using a hot press device.

In the embodiment, it is preferable that the pressurization load P1 at the bonding temperature of the laminated body be set to be in a range of 0.8 MPa to 3.5 MPa (8 kgf/cm² to 35 kgf/cm). In addition, during the temperature increase process to the bonding temperature, the pressurization load P2 in the decomposition temperature range of $T_D-10°$ C. to $T_D+10°$ C. with respect to the decomposition temperature $T_D$ of the organic material included in the temporary bonding material 40 is set to be in a range of 0.1 MPa to 0.7 MPa (1 kgf/cm² to 7 kgf/cm²). A ratio P1/P2 of the pressurization load P1 at the bonding temperature to the pressurization load P2 in the decomposition temperature range of $T_D-10°$ C. to $T_D+10°$ C. with respect to the decomposition temperature $T_D$ of the organic material included in the temporary bonding material 40 during the temperature increase process is preferably in a range of 1.1 to 35.0.

The lower limit of the pressurization load P1 is preferably 0.8 MPa or higher (8 kgf/cm² or higher) and more preferably 1.2 MPa or higher (12 kgf/cm² or higher). The upper limit of the pressurization load P1 is preferably 3.5 MPa or lower (35 kgf/cm² or lower) and more preferably 2.8 MPa or lower (28 kgf/cm² or lower).

The lower limit of the bonding temperature is preferably 440° C. or higher and more preferably 500° C. or higher. The upper limit of the bonding temperature is preferably 548° C. or lower and more preferably 530° C. or lower.

The lower limit of the holding time at the bonding temperature is preferably 30 minutes or longer and more preferably 60 minutes or longer. The upper limit of the holding time at the bonding temperature is preferably 120 minutes or shorter.

Next, as illustrated in FIG. 7, the copper plate 122B is laminated on the first side of the aluminum layer 112A. In a state where the laminated body is pressurized using a pressure device in the laminating direction, the laminated body is charged into a vacuum heating furnace, the aluminum layer 112A and the copper plate 122B are bonded to each other by solid phase diffusion bonding, and the circuit layer 112 in which the aluminum layer 112A and the copper layer 112B are laminated is formed (copper plate bonding step S102).

Bonding conditions in the copper plate bonding step S102 are set as follows: the vacuum condition is in a range of $10^{-6}$ Pa to $10^{-3}$ Pa, the bonding temperature is in a range of 440° C. to 548° C., and the holding time at the bonding temperature is in a range of 30 minutes to 150 minutes.

In the copper plate bonding step S102, during the temperature increase process of heating the laminated body up to the bonding temperature, a pressurization load P22 in the decomposition temperature range of $T_D-10°$ C. to $T_D+10°$ C. with respect to the decomposition temperature $T_D$ of the organic material included in the temporary bonding material 40 is set to be lower than a pressurization load P21 at the bonding temperature.

As described above, in order to control the pressurization loads during the temperature increase process, at the bonding temperature, and during a temperature decrease process, in the embodiment, it is preferable that the laminated body be pressurized using a hot press device.

In the embodiment, it is preferable that the pressurization load P21 at the bonding temperature in the copper plate bonding step S102 be set to be in a range of 0.8 MPa to 3.5 MPa (8 kgf/cm$^2$ to 35 kgf/cm$^2$). In addition, during the temperature increase process to the bonding temperature, the pressurization load P22 in the decomposition temperature range of $T_D-10°$ C. to $T_D+10°$ C. with respect to the decomposition temperature $T_D$ of the organic material included in the temporary bonding material 40 is set to be in a range of 0.1 MPa to 0.7 MPa (1 kgf/cm$^2$ to 7 kgf/cm$^2$).

A ratio P21/P22 of the pressurization load P21 at the bonding temperature to the pressurization load P22 in the decomposition temperature range of $T_D-10°$ C. to $T_D+10°$ C. is preferably in a range of 1.1 to 35.0.

The lower limit of the pressurization load P21 is preferably 0.8 MPa or higher (8 kgf/cm$^2$ or higher) and more preferably 1.2 MPa or higher (12 kgf/cm$^2$ or higher). The upper limit of the pressurization load P21 is preferably 3.5 MPa or lower (35 kgf/cm$^2$ or lower) and more preferably 2.8 MPa or lower (28 kgf/cm$^2$ or lower).

The lower limit of the bonding temperature is preferably 440° C. or higher and more preferably 500° C. or higher. The upper limit of the bonding temperature is preferably 548° C. or lower and more preferably 530° C. or lower. The lower limit of the holding time at the bonding temperature is preferably 60 minutes or longer. The upper limit of the holding time at the bonding temperature is preferably 120 minutes or shorter. Through the above-described steps, the insulating circuit substrate 110 according to the embodiment is produced.

In the method for producing the insulating circuit substrate according to the embodiment having the above-described configuration, in the aluminum plate bonding step S101 and the copper plate bonding step S102, during the temperature increase process of heating the laminated body up to the bonding temperature, the pressurization loads P2 and P22 in the decomposition temperature range of $T_D-10°$ C. to $T_D+10°$ C. with respect to the decomposition temperature $T_D$ of the organic material included in the temporary bonding material 40 are set to be lower than the pressurization loads P1 and P21 at the bonding temperature. Therefore, when the organic material of the temporary bonding material 40 is decomposed to produce decomposition gas, the ceramic substrate 11, the aluminum plate 122A, the aluminum layer 112A, and the copper plate 122B are not strongly pressed, and the decomposition gas can be rapidly exhausted from the bonded interfaces therebetween. The pressurization loads P1 and P21 at the bonding temperature can be set to be high. Accordingly, the ceramic substrate 11 and the aluminum plate 122A can be reliably bonded to each other, and the aluminum layer 112A and the copper plate 122B can be reliably bonded to each other, and the insulating circuit substrate 110 having excellent bonding reliability can be produced.

In addition, during the temperature increase process to the bonding temperature, when the pressurization loads P2 and P22 in the decomposition temperature range of $T_D-10°$ C. to $T_D+10°$ C. are set to be relatively low in a range of 0.1 MPa to 0.7 MPa (1 kgf/cm$^2$ to 7 kgf/cm$^2$), the decomposition gas of the organic material included in the temporary bonding material 40 can be rapidly exhausted from the bonded interface, and the occurrence of bonding defects can be reliably suppressed due to the remaining decomposition gas. In addition, when the pressurization loads P1 and P21 at the bonding temperature are set to be in a range of 0.8 MPa to 3.5 MPa (8 kgf/cm$^2$ to 35 kgf/cm$^2$), the ceramic substrate 11 and the aluminum plate 122A can be strongly bonded to each other, and the aluminum layer 112A and the copper plate 122B can be strongly bonded to each other.

Hereinabove, the embodiment of the present invention has been described. However, the present invention is not limited to the embodiment, and various modifications can be made within a range not departing from the technical ideas of the present invention.

For example, in the description of the embodiment, the power semiconductor element is mounted on the circuit layer of the insulating circuit substrate to configure the power module, but the present invention is not limited thereto. For example, a LED element may be mounted on the insulating circuit substrate to configure a LED module, or a thermoelectric element may be mounted on the circuit layer of the insulating circuit substrate to configure a thermoelectric module.

In the description of the embodiment, the insulating layer is configured with the ceramic substrate, but the present invention is not limited thereto. The insulating layer may be configured with a resin or the like.

In the description of the embodiment, the ceramic substrate and the aluminum plate are bonded to each other using the brazing material, but the present invention is not limited thereto. The ceramic substrate and the aluminum plate may be bonded to each other by solid phase diffusion bonding. The ceramic substrate and the aluminum plate may be bonded to each other using a transient liquid phase bonding method (TLP) of fixing an additive element such as Cu or Si to the bonding surface and diffusing the additive element to be melted and solidified. The ceramic substrate and the aluminum plate may be bonded to each other in a state where the bonded interface is in a semi-molten state.

In the description of the embodiment, the insulating circuit substrate (metal layer) and the heat sink are bonded to each other by solid phase diffusion bonding, but the present invention is not limited thereto. Another bonding method such as brazing or TLP may be adopted.

In the description of the embodiment, the heat sink is formed of a radiating plate of the copper plate, but the present invention is not limited thereto. The heat sink may be formed of a plate formed of aluminum or an aluminum alloy (for example, an A3003 alloy or an A6063 alloy), may be formed of a plate material of a carbon composite material obtained by impregnating a carbon porous body such as SiC with metal, or may include a passage through which a cooling medium flows.

As the carbon composite material, AlSic impregnated with aluminum or an aluminum alloy can be preferably used. In this case, as the impregnated aluminum, a diecast aluminum alloy such as an A6063 alloy or ADC12 may be used.

Figure 8:
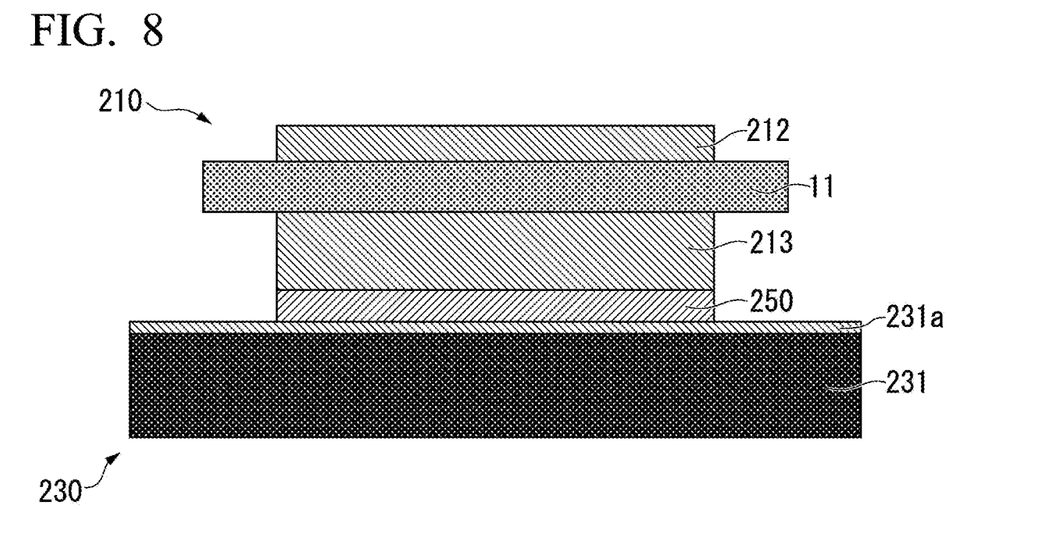
FIG. 8 is a cross-sectional view illustrating an insulating circuit substrate with a heat sink produced using a method for producing an insulating circuit substrate with a heat sink according to another embodiment of the present invention.

When a heat sink formed of a carbon composite material such as AlSiC is used, for example, an insulating circuit substrate with a heat sink 230 having a structure illustrated in FIG. 8 can be provided. In an insulating circuit substrate 210 illustrated in FIG. 8, an aluminum plate is bonded to the first surface of the ceramic substrate 11 to form a circuit layer 212, and an aluminum plate is bonded to the second surface of the ceramic substrate 11 to form a metal layer 213. A heat sink 231 includes a skin layer 231a that is formed of an aluminum material with which a SiC porous body is impregnated. A copper plate 250 is interposed between the insulating circuit substrate 210 and the heat sink 231, the metal layer 213 of the insulating circuit substrate 210 and the copper plate 250 are bonded to each other by solid phase diffusion bonding, and the copper plate 250 and the skin layer 231a of the heat sink 231 are bonded to each other by solid phase diffusion bonding.

In the description of the embodiment, the bonding between the aluminum plate and the ceramic substrate and the bonding between the insulating circuit substrate and the heat sink are performed in different steps, but the present invention is not limited thereto. The bonding between the aluminum plate and the ceramic substrate and the bonding between the insulating circuit substrate and the heat sink may be performed in the same step by laminating the aluminum plate, the ceramic substrate, and the heat sink and pressurizing and heating the laminated body in the laminating direction.

Figure 9:
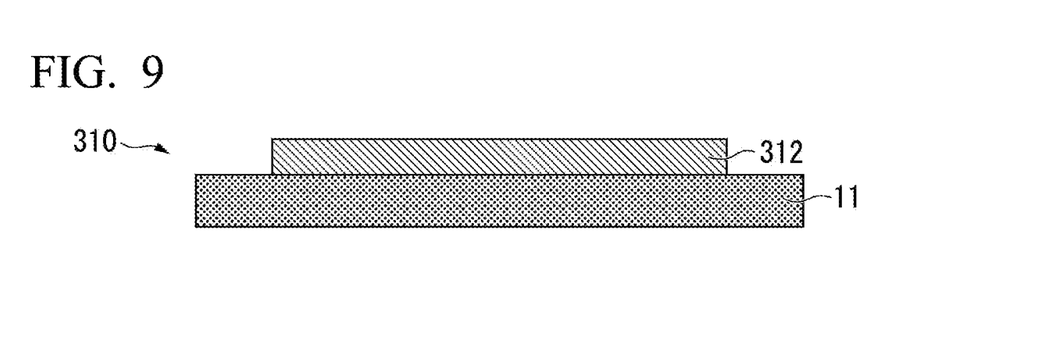
FIG. 9 is a cross-sectional view illustrating an insulating circuit substrate produced using a method for producing an insulating circuit substrate according to another embodiment of the present invention.

For example, as illustrated in FIG. 9, the present invention may be applied to an insulating circuit substrate 310 in which an aluminum plate may be bonded to only the first surface of the ceramic substrate 11 to form a circuit layer 312 and a metal layer is not formed on the second surface of the ceramic substrate 11.

Figure 10:
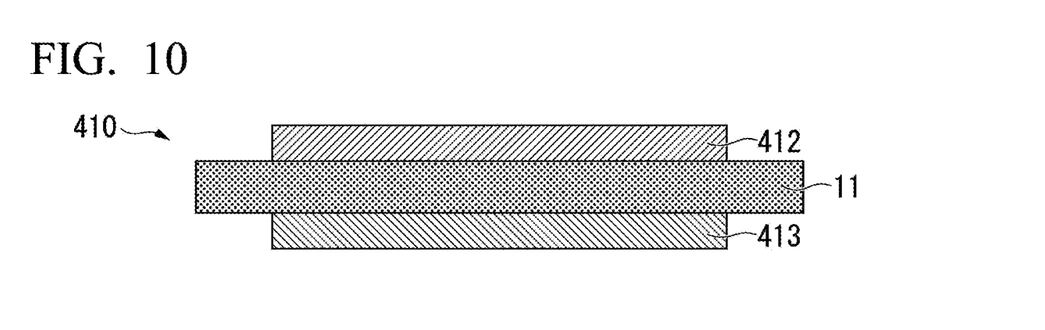
FIG. 10 is a cross-sectional view illustrating an insulating circuit substrate produced using a method for producing an insulating circuit substrate according to another embodiment of the present invention.

As illustrated in FIG. 10, the present invention may be applied to an insulating circuit substrate 410 in which one of a circuit layer 412 and a metal layer 413 is formed of an aluminum plate and the other of the circuit layer 412 and the metal layer 413 is formed of another metal or the like.

EXAMPLES

Hereinafter, Examples for verifying the effects of the present invention will be described.

Example 1

A ceramic substrate (40 mm×40 mm×0.635 mmt) formed of AlN was prepared. An aluminum plate (37 mm×37 mm×0.4 mmt) formed of a rolled material of aluminum or an aluminum alloy shown in Table 2 was laminated on a first surface of the ceramic substrate with a brazing material interposed therebetween. An aluminum plate (37 mm×37 mm×0.4 mmt) formed of a rolled material of aluminum or an aluminum alloy shown in Table 2 was laminated on a second surface of the ceramic substrate with a brazing material interposed therebetween. As the brazing material, a brazing material foil (thickness: 12 μm) formed of Al-7.5 mass % Si alloy was used.

At this time, a temporary bonding material shown in Tables 1 and 2 was arranged on a bonding surface between the ceramic substrate and the aluminum plate, and the ceramic substrate, the aluminum plate, and the brazing material foil were aligned and temporarily bonded. The temporary bonding material was dissolved in a liquid organic solvent (appropriately selected from various alcohols, N-methylpyrrolidone, toluene, and the like) at normal temperature, and the obtained solution was discharged and applied using a dispenser.

When the temporary bonding materials B to F were used, the respective members were laminated after heating the temporary bonding materials to be melted, and then the molten temporary bonding materials were cooled to be solidified for temporary bonding.

The laminated body was pressurized using a pressure device (hot pressing) in a laminating direction and was heated to a bonding temperature shown in Table 2 such that the ceramic substrate and the aluminum plate were bonded to each other. The degree of vacuum was $6.0 \times 10^{-4}$ Pa. At this time, when a decomposition temperature of an organic material included in the temporary bonding material during a temperature increase process to a bonding temperature is represented by $T_D$, a pressurization load from the start of heating to $T_D+10°$ C. was set as a given value P2, and a pressurization load in a process of decreasing the temperature over $T_D+10°$ C. after holding the temperature at the bonding temperature was set as a given value P1. Table 2 shows these bonding conditions.

Regarding the insulating circuit substrate obtained as described above, bondability between the aluminum plate (circuit layer) and the ceramic substrate was evaluated. The evaluation results are shown in Table 2.

(Evaluation of Bondability)

In order to evaluate the bondability, an ultrasonic-detected image of a bonding part between the circuit layer and the ceramic substrate of the insulating circuit substrate was measured using an ultrasonic flaw detector (Fine Sat 200, manufactured by Hitachi Power Solutions Co., Ltd.), and a bonding rate was calculated from the following expression.

An initial bonding area refers to the area to be bonded before bonding, that is, the area of the circuit layer of the insulating circuit substrate.

(Bonding Rate)={(Initial Bonding Area)−(Exfoliation Area)}/(Initial Bonding Area)

In an image obtained by binarizing the ultrasonic-detected image, exfoliation is represented by a white portion in the bonding part. Therefore, the area of the white portion was set as the exfoliation area.

When the bonding rate was 90% or higher, the bondability was evaluated as

Example 2

A heat sink (50 mm×60 mm×5 mmt) formed of oxygen free copper was laminated on the metal layer of the insulating circuit substrate obtained in Example 1.

At this time, the temporary bonding material shown in Tables 1 and 3 was arranged on a bonding surface between the metal layer and the heat sink, and the metal layer and the heat sink were aligned and temporarily bonded. The arrangement of the temporary bonding material was the same as that of Example 1.

When AlSiC and an aluminum alloy (A6063, A3003) was used as the material of the heat sink, the insulating circuit substrate and the heat sink (AlSiC, A6063, A3003) were laminated with a copper plate (37 mm×37 mm×0.2 mmt) interposed therebetween, and the metal layer, the copper plate, and the heat sink were aligned and temporarily bonded.

When the temporary bonding materials B to F were used, the respective members were laminated after heating the temporary bonding materials to be melted, and then the molten temporary bonding materials were cooled to be solidified for temporary bonding.

The laminated body was pressurized using a pressure device (hot pressing) in a laminating direction and was heated to a bonding temperature shown in Table 3 such that the ceramic substrate and the aluminum plate were bonded to each other. The degree of vacuum was $6.0 \times 10^{-4}$ Pa. At this time, during a temperature increase process to a bonding temperature, a pressurization load from the start of heating to $T_D+10°$ C. was set as a given value P12, and a pressurization load in a process of decreasing the temperature over $T_D+10°$ C. after holding the temperature at the bonding temperature was set as a given value P11. Table 3 shows these bonding conditions.

Regarding the insulating circuit substrate with a heat sink obtained as described above, a bonding state between the metal layer and the heat sink was evaluated as follows. The evaluation results are shown in Table 3.

(Evaluation of Bondability)

In order to evaluate the bondability, an ultrasonic-detected image of a bonding part between the metal layer and the heat sink of the insulating circuit substrate with a heat sink (when AlSiC and an aluminum alloy were used, a bonding part between the copper plate (copper layer) and the heat sink) was measured using an ultrasonic flaw detector (Fine Sat 200, manufactured by Hitachi Power Solutions Co., Ltd.), and a bonding rate was calculated from the following expression.

An initial bonding area refers to the area to be bonded before bonding, that is, the area of the metal layer of the insulating circuit substrate with a heat sink.

(Bonding Rate)={(Initial Bonding Area)−(Exfoliation Area)}/(Initial Bonding Area)

In an image obtained by binarizing the ultrasonic-detected image, exfoliation is represented by a white portion in the bonding part. Therefore, the area of the white portion was set as the exfoliation area.

When the bonding rate was 90% or higher, the bondability was evaluated as "O".

TABLE 1

| Temporary Bonding Material No. | Resin | Content (mass %) | Decomposition Temperature $T_D$ (° C.) | Solvent | Content (mass %) | Decomposition Temperature $T_D$ (° C.) | Solvent | Content (mass %) | Decomposition Temperature $T_D$ (° C.) |
|---|---|---|---|---|---|---|---|---|---|
| A | Acrylic Resin (BR101) | 20 | 410 | α-terpineol | 50 | 218 | Texanol | 30 | 247 |
| B | PEG(1000) | 100 | 414 | — | — | — | — | — | — |
| C | Lauric Acid | 100 | 257 | — | — | — | — | — | — |
| D | Myristyl Acid | 100 | 280 | — | — | — | — | — | — |
| E | Palmitic Acid | 100 | 300 | — | — | — | — | — | — |
| F | Stearic Acid | 100 | 321 | — | — | — | — | — | — |

TABLE 2

| | | Aluminum Plate Bonding Conditions | | Pressurization Load (MPa) | | | |
|---|---|---|---|---|---|---|---|
| | Temporary Bonding Material No. | Material of Aluminum Plate | Heating Temperature (° C.) | Holding Time (min) | During Temperature Increase (up to $T_D + 10°$ C.) (P2) | During Holding and Temperature Decrease (from $T_D + 10°$ C.) (P1) | P1/P2 | Bondability |
| Example 1 | A | 4N—Al | 630 | 30 | 0.3 | 2.1 | 7.0 | O |
| Example 2 | A | 4N—Al | 630 | 30 | 0.1 | 2.1 | 21.0 | O |
| Example 3 | A | 4N—Al | 630 | 30 | 0.7 | 2.1 | 3.0 | O |
| Example 4 | A | 4N—Al | 630 | 30 | 0.7 | 0.8 | 1.1 | O |
| Example 5 | A | 4N—Al | 630 | 30 | 0.3 | 0.8 | 2.7 | O |
| Example 6 | A | 4N—Al | 630 | 30 | 0.3 | 3.5 | 11.7 | O |
| Example 7 | A | 4N—Al | 630 | 30 | 0.1 | 3.5 | 35.0 | O |
| Example 8 | A | A1050 | 630 | 30 | 0.3 | 2.1 | 7.0 | O |
| Example 9 | A | A3003 | 630 | 30 | 0.3 | 2.1 | 7.0 | O |
| Example 10 | B | 4N—Al | 630 | 30 | 0.3 | 2.1 | 7.0 | O |
| Example 11 | C | 4N—Al | 630 | 30 | 0.3 | 2.1 | 7.0 | O |
| Example 12 | D | 4N—Al | 630 | 30 | 0.3 | 2.1 | 7.0 | O |
| Example 13 | E | 4N—Al | 630 | 30 | 0.3 | 2.1 | 7.0 | O |
| Example 14 | F | 4N—Al | 630 | 30 | 0.3 | 2.1 | 7.0 | O |
| Comparative Example 1 | A | 4N—Al | 630 | 30 | 2.1 | 2.1 | 1.0 | X |
| Comparative Example 2 | A | 4N—Al | 630 | 30 | 2.1 | 0.8 | 0.4 | X |

TABLE 3

| | | | Heat Sink Bonding Conditions | | Pressurization Load (MPa) | | | |
|---|---|---|---|---|---|---|---|---|
| | Temporary Bonding Material No. | Material of Heat Sink | Heating Temperature (° C.) | Holding Time (min) | During Temperature Increase (up to $T_D$ + 10° C.) (P22) | During Holding and Temperature Decrease (from $T_D$ + 10° C.) (P21) | P21/P22 | Bondability |
| Example 21 | A | C1020 | 510 | 60 | 0.3 | 2.1 | 7.0 | ○ |
| Example 22 | A | C1020 | 510 | 60 | 0.1 | 2.1 | 21.0 | ○ |
| Example 23 | A | C1020 | 510 | 60 | 0.7 | 2.1 | 3.0 | ○ |
| Example 24 | A | C1020 | 510 | 60 | 0.7 | 0.8 | 1.1 | ○ |
| Example 25 | A | C1020 | 510 | 60 | 0.3 | 0.8 | 2.7 | ○ |
| Example 26 | A | C1020 | 510 | 60 | 0.3 | 3.5 | 11.7 | ○ |
| Example 27 | A | C1020 | 510 | 60 | 0.1 | 3.5 | 35.0 | ○ |
| Example 28 | B | C1020 | 510 | 60 | 0.3 | 2.1 | 7.0 | ○ |
| Example 29 | C | C1020 | 510 | 60 | 0.3 | 2.1 | 7.0 | ○ |
| Example 30 | D | C1020 | 510 | 60 | 0.3 | 2.1 | 7.0 | ○ |
| Example 31 | E | C1020 | 510 | 60 | 0.3 | 2.1 | 7.0 | ○ |
| Example 32 | F | C1020 | 510 | 60 | 0.3 | 2.1 | 7.0 | ○ |
| Example 33 | A | AlSiC | 510 | 60 | 0.3 | 2.1 | 7.0 | ○ |
| Example 34 | A | A3003 | 510 | 60 | 0.3 | 2.1 | 7.0 | ○ |
| Example 35 | A | A6063 | 510 | 60 | 0.3 | 2.1 | 7.0 | ○ |
| Comparative Example 21 | A | C1020 | 510 | 60 | 2.1 | 2.1 | 1.0 | X |
| Comparative Example 22 | A | C1020 | 510 | 60 | 2.1 | 0.8 | 0.4 | X |

In Comparative Examples 1 and 2 and Comparative Examples 21 and 22 in which the pressurization load P2 when the temperature was increased (up to the decomposition temperature $T_D$+10° C.) was the same as the pressurization load P1 when the temperature was held at the bonding temperature and was decreased and the pressurization load was 2.1 MPa, a residue of the organic material remained in the bonded interface, and the bondability was insufficient.

On the other hand, in Examples in which the pressurization load P2 when the temperature was increased (up to the decomposition temperature $T_D$+10° C.) was set to be lower than the pressurization load P1 when the temperature was held at the bonding temperature and was decreased, the bondability was excellent irrespective of the use of the plural kinds of temporary bonding materials shown in Table 1. It is presumed that a residue of the organic material did not remain in the bonded interface.

INDUSTRIAL APPLICABILITY

According to the present invention, decomposition gas produced from an organic material of a temporary bonding material during bonding can be sufficiently exhausted from a bonded interface such that members can be stably bonded to each other. Therefore, the present invention is industrially applicable.

REFERENCE SIGNS LIST

1: POWER MODULE
3: SEMICONDUCTOR ELEMENT
10, 110: INSULATING CIRCUIT SUBSTRATE
11: CERAMIC SUBSTRATE (INSULATING LAYER)
12, 112: CIRCUIT LAYER
13, 113: METAL LAYER (ALUMINUM PLATE)
30: INSULATING CIRCUIT SUBSTRATE WITH HEAT SINK
31: HEAT SINK

The invention claimed is:

1. A method for producing a bonded body in which a first member and a second member are bonded to each other, the method comprising:

a laminating step of forming a laminated body in which the first member and the second member are temporarily bonded to each other by providing a temporary bonding material including an organic material on at least one of a bonding surface of the first member and a bonding surface of the second member and laminating the first member and the second member via the temporary bonding material; and a bonding step of pressurizing and heating the laminated body in a laminating direction and bonding the first member and the second member to each other, wherein in the bonding step, during a temperature increase process of heating the laminated body up to a predetermined bonding temperature, at least a pressurization load P2 at a decomposition temperature $T_D$ of the organic material included in the temporary bonding material is lower than a pressurization load P1 at the bonding temperature; and wherein the pressurization load P2 in the bonding step is in a decomposition temperature range of $T_D$−10° C. to $T_D$+10° C. with respect to the decomposition temperature $T_D$ of the organic material included in the temporary bonding material.

2. The method for producing a bonded body according to claim 1, wherein the pressurization load P2 is in a range of 0.1 MPa to 0.7 MPa.

3. A method for producing an insulating circuit substrate including an insulating layer and a metal plate that is bonded to at least a single surface of the insulating layer, wherein the insulating layer as the first member and the metal plate as the second member are bonded to each other using the method for producing a bonded body according to claim 2.

4. A method for producing an insulating circuit substrate including an insulating layer and a metal plate that is bonded to at least a single surface of the insulating layer, wherein the metal plate is a laminated plate including a first metal plate and a second metal plate that is formed of a material different from that of the first metal plate, and the first metal plate as the first member and the second metal plate as the second member are bonded to each other using the method for producing a bonded body according to claim 2.

5. A method for producing an insulating circuit substrate with a heat sink including an insulating circuit substrate and a heat sink, the insulating circuit substrate including an insulating layer and a metal plate that is bonded to at least a single surface of the insulating layer, and the heat sink being provided on another surface side of the insulating layer,
wherein the insulating circuit substrate as the first member and the heat sink as the second member are bonded to each other using the method for producing a bonded body according to claim 2.

6. A method for producing an insulating circuit substrate including an insulating layer and a metal plate that is bonded to at least a single surface of the insulating layer,
wherein the insulating layer as the first member and the metal plate as the second member are bonded to each other using the method for producing a bonded body according to claim 1.

7. A method for producing an insulating circuit substrate including an insulating layer and a metal plate that is bonded to at least a single surface of the insulating layer,
wherein the metal plate is a laminated plate including a first metal plate and a second metal plate that is formed of a material different from that of the first metal plate, and
the first metal plate as the first member and the second metal plate as the second member are bonded to each other using the method for producing a bonded body according to claim 1.

8. A method for producing an insulating circuit substrate with a heat sink including an insulating circuit substrate and a heat sink, the insulating circuit substrate including an insulating layer and a metal plate that is bonded to at least a single surface of the insulating layer, and the heat sink being provided on another surface side of the insulating layer,
wherein the insulating circuit substrate as the first member and the heat sink as the second member are bonded to each other using the method for producing a bonded body according to claim 1.

9. A method for producing an insulating circuit substrate including an insulating layer and a metal plate that is bonded to at least a single surface of the insulating layer,
wherein the insulating layer as the first member and the metal plate as the second member are bonded to each other using a method for producing a bonded body in which a first member and a second member are bonded to each other, the method comprising:
a laminating step of forming a laminated body in which the first member and the second member are temporarily bonded to each other by providing a temporary bonding material including an organic material on at least one of a bonding surface of the first member and a bonding surface of the second member and laminating the first member and the second member via the temporary bonding material; and
a bonding step of pressurizing and heating the laminated body in a laminating direction and bonding the first member and the second member to each other,
wherein in the bonding step, during a temperature increase process of heating the laminated body up to a predetermined bonding temperature, at least a pressurization load P2 at a decomposition temperature $T_D$ of the organic material included in the temporary bonding material is lower than a pressurization load P1 at the bonding temperature; and
wherein the pressurization load P2 is in a range of 0.1 MPa to 0.7 MPa.

10. A method for producing an insulating circuit substrate including an insulating layer and a metal plate that is bonded to at least a single surface of the insulating layer,
wherein the metal plate is a laminated plate including a first metal plate and a second metal plate that is formed of a material different from that of the first metal plate, and
the first metal plate as the first member and the second metal plate as the second member are bonded to each other using a method for producing a bonded body in which a first member and a second member are bonded to each other, the method comprising:
a laminating step of forming a laminated body in which the first member and the second member are temporarily bonded to each other by providing a temporary bonding material including an organic material on at least one of a bonding surface of the first member and a bonding surface of the second member and laminating the first member and the second member via the temporary bonding material; and
a bonding step of pressurizing and heating the laminated body in a laminating direction and bonding the first member and the second member to each other,
wherein in the bonding step, during a temperature increase process of heating the laminated body up to a predetermined bonding temperature, at least a pressurization load P2 at a decomposition temperature $T_D$ of the organic material included in the temporary bonding material is lower than a pressurization load P1 at the bonding temperature; and
wherein the pressurization load P2 is in a range of 0.1 MPa to 0.7 MPa.

11. A method for producing an insulating circuit substrate with a heat sink including an insulating circuit substrate and a heat sink, the insulating circuit substrate including an insulating layer and a metal plate that is bonded to at least a single surface of the insulating layer, and the heat sink being provided on another surface side of the insulating layer,
wherein the insulating circuit substrate as the first member and the heat sink as the second member are bonded to each other using a method for producing a bonded body in which a first member and a second member are bonded to each other, the method comprising:
a laminating step of forming a laminated body in which the first member and the second member are temporarily bonded to each other by providing a temporary bonding material including an organic material on at least one of a bonding surface of the first member and a bonding surface of the second member and laminating the first member and the second member via the temporary bonding material; and
a bonding step of pressurizing and heating the laminated body in a laminating direction and bonding the first member and the second member to each other,
wherein in the bonding step, during a temperature increase process of heating the laminated body up to a predetermined bonding temperature, at least a pressurization load P2 at a decomposition temperature $T_D$ of the organic material included in the temporary bonding material is lower than a pressurization load P1 at the bonding temperature; and wherein the pressurization load P2 is in a range of 0.1 MPa to 0.7 MPa.

* * * * *